United States Patent [19]

Leak

[11] Patent Number: 5,423,047
[45] Date of Patent: Jun. 6, 1995

[54] METHODS AND APPARATUS FOR USING ADDRESS TRANSITION DETECTION TO REDUCE POWER CONSUMPTION

[75] Inventor: David A. Leak, Rancho Cordova, Calif.

[73] Assignee: Intel Corporation, Santa Clara, Calif.

[21] Appl. No.: 80,694

[22] Filed: Jun. 22, 1993

Related U.S. Application Data

[63] Continuation of Ser. No. 901,565, Jun. 19, 1992, abandoned.

[51] Int. Cl.[6] .................. G11C 7/00; G06F 12/00
[52] U.S. Cl. .................. 395/750; 365/227;
364/273.2; 364/273.1; 364/273.3; 364/240;
364/264; 364/264.5; 364/244; 364/DIG. 1
[58] Field of Search ............... 395/750, 425; 364/707;
365/227, 230.06.233.5, 230.08

[56] References Cited

U.S. PATENT DOCUMENTS

| | | | |
|---|---|---|---|
| 4,575,821 | 3/1986 | Eden et al. | 365/154 |
| 4,727,517 | 2/1988 | Ueno et al. | 365/203 |
| 4,901,279 | 2/1990 | Plass | 365/154 |
| 4,918,658 | 4/1990 | Shah et al. | 365/227 |
| 4,962,487 | 2/1990 | Suzuki | 365/233.5 |
| 5,128,897 | 7/1992 | McClure | 365/230.06 |
| 5,175,451 | 12/1992 | Ihara | 307/530 |
| 5,214,610 | 5/1993 | Houston | 365/233.5 |
| 5,233,565 | 8/1993 | Wang | 365/233.5 |
| 5,305,268 | 4/1994 | McClure | 365/203 |
| 5,343,428 | 8/1994 | Pilo et al. | 365/189.05 |
| 5,355,343 | 10/1994 | Shu et al. | 365/203 |

Primary Examiner—Gopal C. Ray
Attorney, Agent, or Firm—Blakely, Sokoloff, Taylor & Zafman

[57] ABSTRACT

A method and apparatus for using address transition detection in a device to reduce power consumption. An address transition detection and power reduction circuit for the device detects address transitions on an address bus. The address transition detection circuit enables circuits for processing the new data for the new address transition. Thereafter, the device processes the new address. The address transition detection and power reduction circuit then disables the circuits for processing the address transition to reduce DC power consumption until the next address transition is detected.

14 Claims, 4 Drawing Sheets

METHODS AND APPARATUS FOR USING ADDRESS TRANSITION DETECTION TO REDUCE POWER CONSUMPTION

This is a continuation of application Ser. No. 07/901,565, filed on Jun. 19, 1992, now abandoned.

FIELD OF THE INVENTION

The present invention pertains to computer system architecture and integrated circuit devices. More particularly, this invention relates to minimizing power consumption of devices in a computer system.

BACKGROUND OF THE INVENTION

In a computer system, devices are often coupled for communication using address signals transmitted over an address bus, and data signals transmitted over a data bus. Devices coupled for communication over the address and data busses typically contain circuitry for receiving addresses over the address bus, as well as circuitry for responding to the addresses and circuitry for transferring data over the data bus.

For example, a typical memory device receives addresses over the address bus, and in turn accesses an internal memory array which stores data. The memory device typically contains specialized circuitry for accessing the memory array, specialized circuitry for sensing the contents of the memory array, and circuitry for transmitting the data out of the memory array over the data bus.

Unfortunately, the device circuitry for receiving addresses over the address bus, for responding to the addresses, and for transferring data over the data bus typically draw a constant DC current even when not in use. For example, in a typical memory device, circuits for accessing the memory array, for sensing the contents of the memory array, and for transmitting the data from the memory array over the data bus draw DC current between address transitions on the address bus. As a result, the device consumes excessive DC current, which contributes to excessive power consumption of the system.

Some past devices have a standby mode for occasional use to reduce power consumption. Such devices require a CPU to switch the device into standby mode when the device is not needed. If the device then becomes needed, the CPU switches the device back to a normal mode. However, the standby mode is not suitable for reducing device power consumption between accesses during normal system operation. The overhead required for the CPU to switch modes of the device would dramatically reduce throughput to the device.

SUMMARY AND OBJECTS OF THE INVENTION

One object of the present invention is to reduce the power consumption of devices in computer system.

Another object of the present invention is to reduce the power consumption during normal operation of devices coupled to an address bus in a computer system.

Another object of the present invention is to selectively enable and disable circuits within a device according to address transitions detected over an address bus.

Another object of the present invention is to reduce the power consumption of a memory device by enabling and disabling memory array access circuits, sense amplifier circuits, and output buffer circuits through the use of address transition detection.

A further object of the present invention is to increase the battery life of systems by selectively enabling and disabling unused circuits according to address transitions detected.

These and other objects of the invention are provided by a method and apparatus for using address transition detection to reduce power consumption. An address transition detection and power reduction circuit for a device detects address transitions on an address bus. The address transition detection circuit enables circuits for processing the address transition. For a memory device, some of the circuits for processing the new data for the address transition comprise sense amplifier circuits, drain bias circuits, and a drain bias reference circuit. A memory device processes the address by decoding the address transition, by accessing memory cells of a memory array, and by latching logic bits sensed by the sense amplifier circuits. Thereafter, the address transition detection and power reduction circuit disables the circuits for processing the new data for a new address transition. For a memory device, the address transition detection and power reduction circuit disables the sense amplifier circuits, the drain bias circuits, and the drain bias reference circuit to reduce DC power consumption until the next address transition is detected.

Other objects, features and advantages of the present invention will be apparent from the accompanying drawings, and from the detailed description that follows below.

BRIEF DESCRIPTION OF THE DRAWINGS

The present invention is illustrated by way of example and not limitation in the figures of the accompanying drawings in which like references indicate similar elements, and in which.

DETAILED DESCRIPTION

Figure 1:
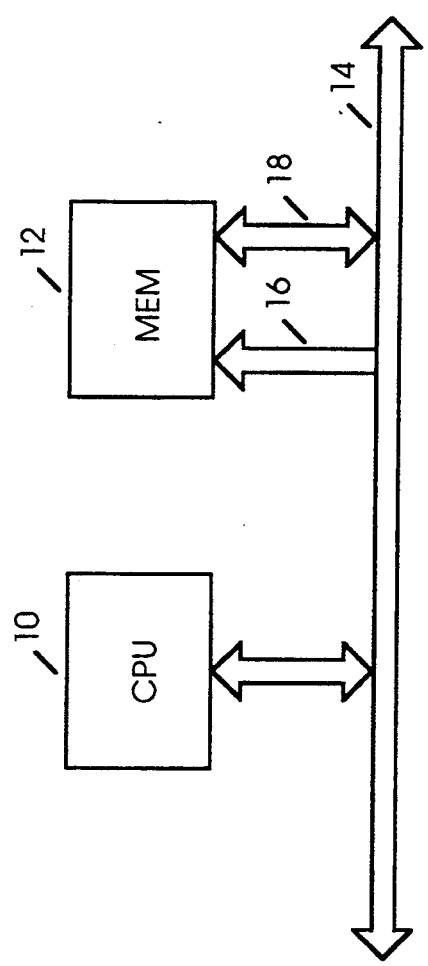
FIG. 1 is a block diagram showing a CPU coupled for communication to a memory device over a bus.

FIG. 1 is a block diagram showing a CPU 10 coupled for communication with a memory device 12 over a bus 14. The bus 14 is comprised of address, data, and control signal lines. The bus 14 represents a wide variety of busses used for communication between elements of a computer system.

The memory device 12 is coupled to receive addresses over an address portion 16 of the bus 14. The memory device 12 is coupled to transfer data over a data portion 18 of the bus 14. The memory device 12 is also coupled to transfer control signals over a control portion (not shown) of the bus 14. For one embodiment, the memory device 12 is a flash memory device.

Figure 2:
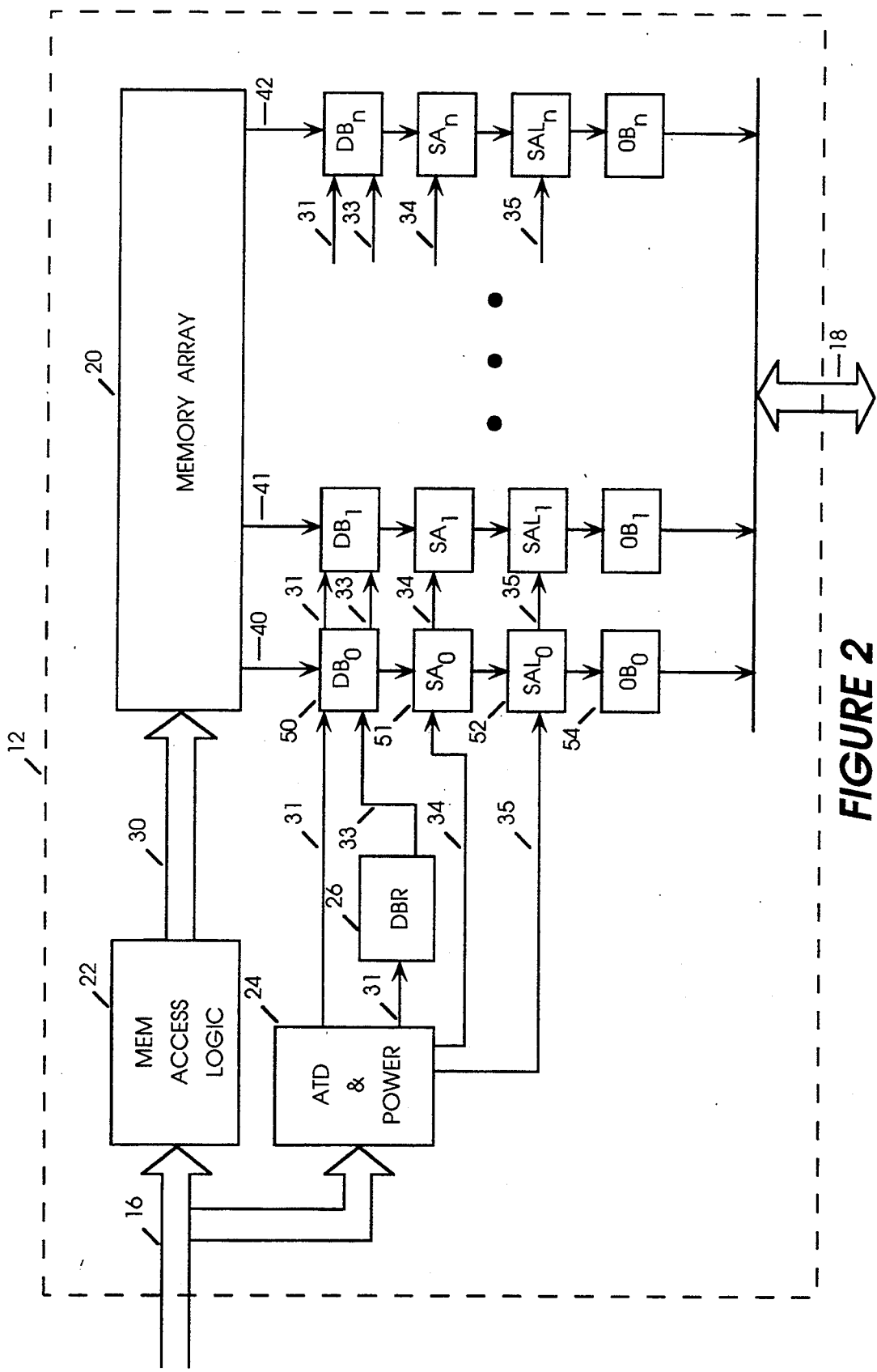
FIG. 2 is a block diagram illustrating circuit elements of the memory device, including a memory array, drain bias and drain bias reference circuits, sense amplifier circuits, output buffer circuits, an address decoding circuit, and an address transition detection and power reduction circuit.

FIG. 2 is a block diagram illustrating circuit elements of the memory device 12 for one embodiment. A memory access logic circuit 22 is coupled to receive address over the address portion 16 of the bus 14. The memory access logic circuit 22 decodes the received addresses, and generates memory array access signals over an access signal bus 30.

A memory array 20 contains memory cells for the flash memory device 12. The memory array 20 is coupled to receive the memory array access signals over the access signal bus 30. The memory access signals cause the memory array 20 to couple selected memory cells to a set of bit lines. For one embodiment, the memory array 20 holds 4 megabits of data.

Each bit line output of the memory array 20 is coupled for transfer through a drain bias circuit (DB), a sense amplifier circuit (SA), a sense amplifier latch circuit (SAL), and an output buffer circuit (OB).

For example, the bit line output 40 of the memory array 20 is coupled for transfer through a $DB_0$ 50, a $SA_0$ 51, a $SAL_0$ 52, and an $OB_0$ 54. Similarly, the bit line output 41 of the memory array 20 is coupled for transfer through a $DB_1$, a $SA_1$, a $SAL_1$, and an $OB_1$, and the bit line output 42 of the memory array 20 is coupled for transfer through a $DB_n$, a $SA_n$, a $SAL_n$, and an $OB_n$. For one embodiment, the bit line outputs of the memory array 20 comprise 16 outputs.

The functions of the DB's, the SA's, the SAL's, and the OB's are substantially similar, and are discussed below for the example $DB_0$ 50, the $SA_0$ 51, the $SAL_0$ 52, and the $OB_0$ 54.

The $DB_0$ 50 controls the drain bias voltage level of the memory cell in the memory array 20 coupled to the bit line output 40. The $DB_0$ 50 ensures that the drain bias voltage level for the memory cell does not attain a high level and reverse the logic state of the memory cell. The $DB_0$ 50 contains transistor bias circuits that draw DC current when the $DB_0$ 50 is enabled. The $DB_0$ 50 is coupled to received a drain bias reference signal over a signal line 33.

The drain bias reference signal 33 is generated by a drain bias reference circuit (DBR) 26. The drain bias reference signal 33 is used by the $DB_0$ 50 to set the drain bias voltage level of the memory cell coupled to the bit line 40 for accessing the memory array 20. The DBR 26 contains transistor bias circuits that draw DC current when the DBR 26 is enabled.

The $DB_0$ 50 passes the amount of current drawn by the memory cell coupled to the bit line output 40 to the $SA_0$ 51. The $SA_0$ 51 compares the voltage of the bit line 40 with a reference voltage to determine the logic state of the memory cell coupled to the bit line 40. The $SA_0$ 51 contains transistor circuits that draw DC current when the $SA_0$ 51 is enabled.

The $SAL_0$ 52 latches the data from the $SA_0$ 50. The $OB_0$ 54 buffers the data bit on the bit line output 40 for transfer over the data portion 18 of the bus 14.

An address transition detection and power reduction circuit (ATD & POWER) 24 is coupled to receive addresses over the address portion 16 of the bus 14. The ATD & POWER 24 detects address transition over the address portion 16 of the bus 14, and generates control signals to enable and disable circuitry to reduce power consumption by the memory device 12.

The ATD & POWER 24 generates a drain bias enable (DBEN) signal over a signal line 31, which is coupled for transfer to the DBR 26 and the drain bias circuits ($DB_0$-$DB_n$). A high logic state of the DBEN signal 31 switches on transistor bias circuits within the DBR 26 and the drain bias circuits $DB_0$-$DB_n$. A low logic state of the DBEN signal 31 switches off transistor bias circuits within the DBR 26 and the drain bias circuits $DB_0$-$DB_n$.

The ATD & POWER 24 generates a sense amplifier enable (SAEN) signal over a signal line 34, which is coupled for transfer to the sense amplifier circuits $SA_0$–$SA_n$. A high logic state of the SAEN signal 34 switches on transistor circuits within the sense amplifier circuits $SA_0$-$SA_n$, and a low logic state of the SAEN signal 34 switches off transistor circuits within the sense amplifier circuits $SA_0$-$SA_n$.

The ATD & POWER 24 generates a sense amplifier latch enable (SALEN) signal over a signal line 35, which is coupled for transfer to the sense amplifier latch circuits $SAL_0$-$SAL_n$. The SALEN signal 35 causes the sense amplifier latch circuits $SAL_0$-$SAL_n$ to latch the outputs of the sense amplifier circuits $SA_0$-$SA_n$.

Figure 3:
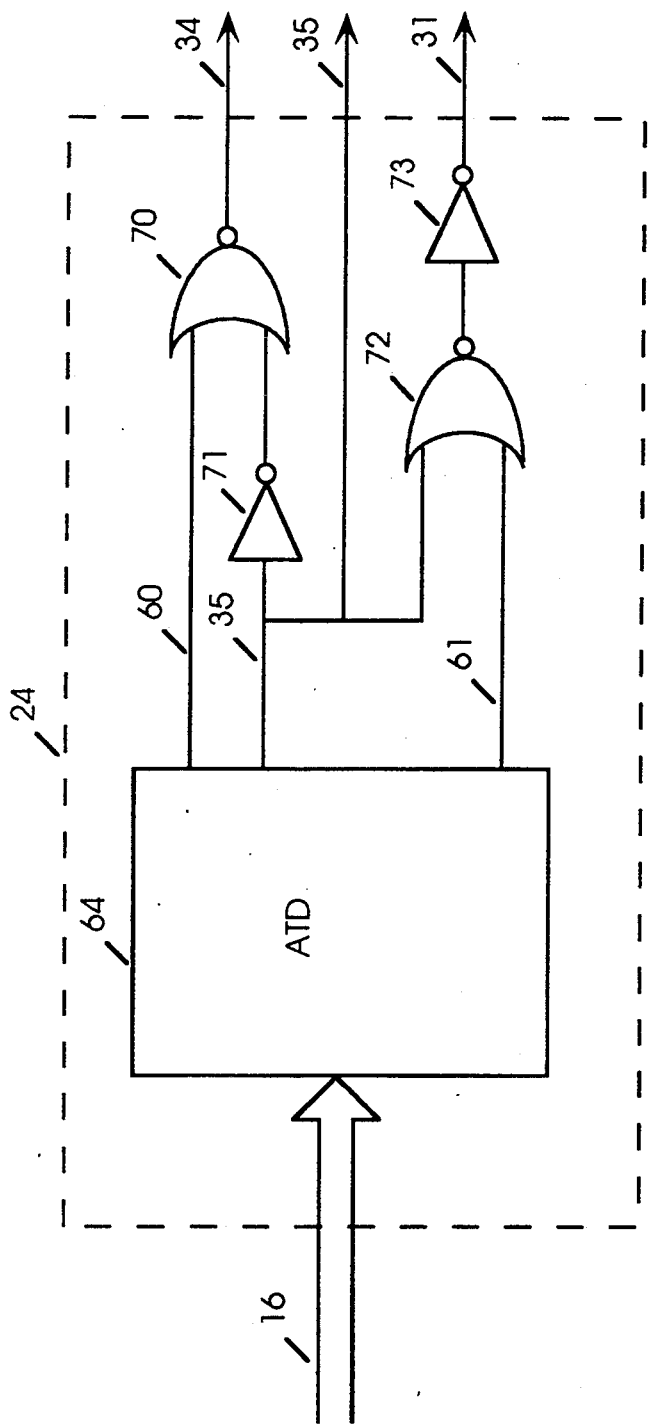
FIG. 3 illustrates the address transition detection and power reduction circuit for one embodiment, which is comprised of an address transition detection circuit and logic gates.

FIG. 3 illustrates the ATD & POWER 24 for one embodiment. The ATD & POWER 24 is comprised of an address transition detection circuit (ATD) 64 and logic gates 70–73. The ATD 64 generates the SALEN signal 35, as well as an ATD_MP signal 61 and an ATD_PWR signal 60.

The ATD 64 detects address transitions for each address signal of the address portion 16 of the bus 14, and generates a pulse whenever a transition is detected. The ATD_MP signal 61 is a summation of the ATD pulses generated for the address signals. The ATD_PWR signal 60 is used for sense amplifier power reduction.

The SAEN signal 34 is generated by a NOR gate 70, which has as inputs the inverted SALEN signal 35 through an inverter 71, and the ATD_PWR signal 60. The SALEN signal 35 and the ATD_MP signal 61 are input to a NOR gate 72. The output of the NOR gate 72 is inverted by an inverter 73 to generate the DBEN signal 31.

Figure 4:
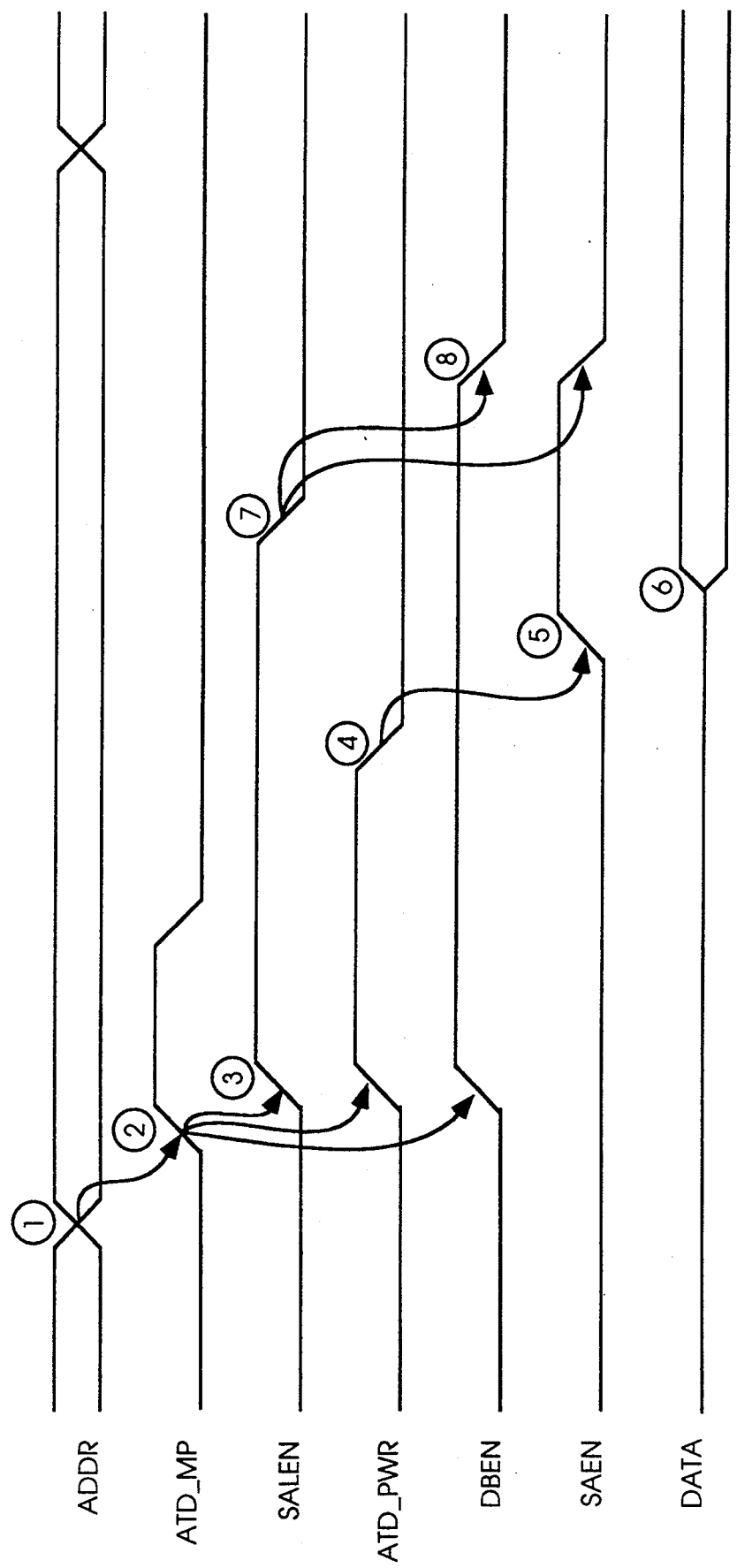
FIG. 4 illustrates the timing for signals generated by the address transition detection and power reduction circuit for one embodiment to reduce power consumption by the memory device.

FIG. 4 illustrates the timing for power reduction of circuit elements of the device 12. The ATD & POWER 24 detects address transitions over the address portion 16 of the bus 14, and generates signals to selectively enable and disable circuit elements and latch data from the memory array 20. The timing of address signals received (ADDR) and the data transmitted (DATA) is shown, along with the ATD_MP signal 61, the SALEN signal 35, the ATD_PWR signal 60, the DBEN signal 31, and the SAEN signal 34.

At time 1, the ATD 64 detects address transitions in the ADDR signal received over the address portion 16 of the bus 14. In response, the ATD 64 generates a low to high transition of the ATD_MP signal 61 at time 2. The low to high transition of the ATD_MP signal 61 causes low to high transitions at time 3 of the SALEN signal 35, the ATD_PWR signal 60, and the DBEN signal 31.

The high logic state of the DBEN signal 31 enables the DBR 26 and the drain bias circuits $DB_0$-$DB_n$. The high logic state of the DBEN signal 31 switches on transistor bias circuits within the DBR 26 that generated the drain bias reference signal 33. Also, the high logic state of the DBEN signal 31 switches on transistor bias circuits within the drain bias circuits $DB_0$-$DB_n$ to set the drain bias voltage levels for the memory cells of the memory array 20 being accessed.

At time 4, the ATD 64 generates a high to low transition of the ATD_PWR signal 60 to enable the sense amplifier circuits $SA_0$–$SA_n$. The high to low transition of the ATD_PWR signal 60 causes a low to high transition of the SAEN signal 34 at time 5. The high logic state of the SAEN signal 34 enables the sense amplifier circuits $SA_0$–$SA_n$.

Thereafter a time 6, the output buffer circuits $OB_0$–$OB_n$ transmit the data (DATA) from the accessed memory cells over the data portion 18 of the bus 14. At time 7, the ATD & POWER 24 generates a high to low transition of the SALEN signal 35, which causes the sense amplifier latch circuits $SAL_0$–$SAL_n$ to latch the outputs of the sense amplifier circuits $SA_0$–$SA_n$.

At time 8, the ATD & POWER 24 disables the drain bias circuits. The ATD & POWER 24 generates high to low transition of the DBEN signal 31, which disables the DBR 26 and the drain bias circuits $DB_0$–$DB_n$. The low logic state of the DBEN signal 31 switches off transistor bias circuits in the DBR 26 and the drain bias circuits $DB_0$–$DB_n$ to reduce DC current flow, and thereby reduce power consumption.

Also at time 8, the ATD & POWER 24 disables the sense amplifier circuits. The ATD & POWER 24 generates high to low transition of the SAEN signal 34, which disables the sense amplifier circuits $SA_0$–$SA_n$. The low logic state of the SAEN signal 34 switches off transistor bias circuits in the sense amplifier circuits $SA_0$–$SA_n$ to reduce DC current flow, and thereby reduce power consumption.

Thereafter, the sense amplifier latch circuits $SAL_0$–$SAL_n$ hold the data for output by the output buffer circuits $OB_0$–$OB_n$. The drain bias circuits DBR 26 and $DB_0$–$DB_n$, and the sense amplifier circuits $SA_0$–$SA_n$ remain disabled to reduce power consumption until the next address transition is detected by the ATD & POWER 24.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method for reducing power consumption of a memory device, comprising the steps of:
    detecting an address transition over a bus coupled to the memory device;
    enabling a drain bias reference circuit in the memory device such that the drain bias reference circuit generates a drain bias reference voltage;
    enabling at least one drain bias circuit in the memory device such that each drain bias circuit senses the drain bias reference voltage and sets a drain bias voltage level on at least one bit line coupled to a set of memory cells in the memory device;
    enabling at least one sense amplifier circuit in the memory device such that each sense amplifier circuit senses a logic state of the memory cells over the bit line;
    accessing the memory cells and latching the logic state of the memory cells; and
    disabling the drain bias reference circuit, each drain bias circuit, and each sense amplifier circuit.

2. The method of claim 1, wherein the step of enabling a drain bias reference circuit comprises the step of switching on transistor bias circuits in the drain bias reference circuit.

3. The method of claim 1, wherein the step of enabling at least one drain bias circuit comprises the step of switching on transistor bias circuits in each drain bias circuit.

4. The method of claim 1, wherein the step of enabling at least one sense amplifier circuit comprises the step of switching on transistor bias circuits in each sense amplifier circuit.

5. The method of claim 1, wherein the step of disabling the drain bias reference circuit, each drain bias circuit, and each sense amplifier circuit comprises the steps of switching off transistor bias circuits in the drain bias reference circuit, switching off transistor bias circuits in each drain bias circuit, and switching off transistor bias circuits in each sense amplifier circuit.

6. An apparatus for reducing power consumption of a memory device, comprising:
    means for detecting an address transition over a bus coupled to the device;
    means for enabling a drain bias reference circuit in the device such that the drain bias reference circuit generates a drain bias reference voltage;
    means for enabling at least one drain bias circuit in the device such that each drain bias circuit senses the drain bias reference voltage and sets a drain bias voltage level on at least one bit line coupled to a set of memory cells in the device;
    means for enabling at least one sense amplifier circuit in the device such that each sense amplifier circuit senses a logic state of the memory cells over the bit line;
    means for accessing the memory cells and latching the logic state of the memory cells; and
    means for disabling the drain bias reference circuit, each drain bias circuit, and each sense amplifier circuit.

7. The apparatus of claim 6, wherein the means for enabling a drain bias reference circuit comprises means for switching on transistor bias circuits in the drain bias reference circuit.

8. The apparatus of claim 6, wherein the means for enabling at least one drain bias circuit comprises means for switching on transistor bias circuits in each drain bias circuit.

9. The apparatus of claim 6, wherein the means for enabling at least one sense amplifier circuit comprises means for switching on transistor bias circuits in each sense amplifier circuit.

10. The apparatus of claim 6, wherein the means for disabling the drain bias reference circuit, each drain bias circuit, and each sense amplifier circuit comprises means for switching off transistor bias circuits in the drain bias reference circuit, switching off transistor bias circuits in each drain bias circuit, and switching off transistor bias circuits in each sense amplifier circuit.

11. A memory device, comprising:
    control circuit that detects an address transition on a bus, and that asserts a drain bias enable signal and a sense amplifier enable signal and that then asserts a sense amplifier latch enable signal;
    drain bias reference circuit that generates a drain bias reference voltage in response to the drain bias enable signal;
    drain bias circuit that senses the drain bias reference voltage and that sets a drain bias voltage level on a bit line coupled to a memory cell in response to the drain bias enable signal;

sense amplifier circuit that senses a logic state of the memory cell over the bit line in response to the sense amplifier enable signal; and sense amplifier latch circuit that latches the logic state of the memory cell in response to the sense amplifier latch enable signal;

wherein the control circuit deasserts the drain bias enable and sense amplifier enable signals to disable the drain bias reference circuit, the drain bias circuit, and the sense amplifier circuit after the sense amplifier latch circuit latches the logic state of the memory cell.

12. The memory device of claim 11, wherein the drain bias enable signal controls on and off states of transistor bias circuits in the drain bias reference circuit.

13. The memory device of claim 11, wherein the drain bias enable signal controls on and off states of transistor bias circuits in the drain bias circuit.

14. The memory device of claim 11, wherein the sense amplifier enable signal controls on and off states of transistor bias circuits in the sense amplifier circuit.

* * * * *